United States Patent
Khayrallah et al.

(10) Patent No.: US 6,798,852 B2
(45) Date of Patent: Sep. 28, 2004

(54) METHODS AND SYSTEMS FOR EXTRACTING A JOINT PROBABILITY FROM A MAP DECISION DEVICE AND PROCESSING A SIGNAL USING THE JOINT PROBABILITY INFORMATION

(75) Inventors: Ali S. Khayrallah, Apex, NC (US); Gregory E. Bottomley, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 826 days.

(21) Appl. No.: 09/742,173

(22) Filed: Dec. 20, 2000

(65) Prior Publication Data

US 2002/0003846 A1 Jan. 10, 2002

Related U.S. Application Data

(63) Continuation-in-part of application No. 09/587,995, filed on Jun. 6, 2000, now Pat. No. 6,697,441.

(51) Int. Cl.[7] .............................................. G06F 9/46
(52) U.S. Cl. ...................................... 375/341; 718/794
(58) Field of Search .............................. 375/262, 265, 375/340, 341; 718/780, 792, 794, 795, 796

(56) References Cited

U.S. PATENT DOCUMENTS

| 4,631,735 A | 12/1986 | Qureshi ........................ 375/34 |
| 5,233,630 A | 8/1993 | Wolf ............................. 375/67 |
| 5,438,590 A | 8/1995 | Tzukerman et al. ......... 375/259 |
| 5,673,291 A | 9/1997 | Dent ............................. 375/262 |
| 2002/0015457 A1 * | 2/2002 | Obuchi et al. .............. 375/340 |

FOREIGN PATENT DOCUMENTS

WO    WO 98/04047    1/1998
WO    WO 98/59423    12/1998

OTHER PUBLICATIONS

International Search Report for PCT/US01/16041.
Jung–Fu Cheng and Lin–shan Lee, *Complexity–Reduced Multilevel Coding with Rate–Compatible Punctured Convolutional Codes, IEEE Global Telecommunications Conference 1993*, Houston Texas.
A. Mark Earnshaw, *Combined Soft–Decision Deinterleaver/Decoder for the IS95 ReverseLink, IEEE Transactions on Vehicular Technology*, vol. 49, No. 2, Mar. 2000.
L.R. Bahl, J. Cocke, F. Jelinek and J. Raviv, *Optimal Decoding of Linear Codes for Minimizing Symbol Error Rate, IEEE Trans. Inform. Thy.*, pp. 284–287, Mar. 1974.
L.R. Bahl, J. Cocke, F. Jelinek and J. Raviv, *Optimal Decoding of Linear Codes for Minimizing Symbol Error Rate, IEEE Trans. Inform. Thy.*, pp. 284–287, Mar. 1974.
H. Shankar, *Emerging Technology Series #1 Edge in Wireless Data, COMMDESIGN*, 'Online!, Jan. 2000, pp. 1–7.
International Search Report for PCT/US01/46036.

* cited by examiner

*Primary Examiner*—Amanda T. Le
(74) *Attorney, Agent, or Firm*—Myers Bigel Sibley & Sajovec

(57) ABSTRACT

Methods and devices for extracting a joint probability from a MAP decision device are provided. Probability information associated with a first symbol and a second symbol is obtained from the MAP decision device. A joint probability of the first symbol and the second symbol is determined from the probability information associated with the first symbol and the second symbol. Methods and devices for processing a signal containing information associated with a plurality of transmitted bits using the generated joint probability information are also provided. The MAP decision device in various embodiments is a demodulator or a decoder.

50 Claims, 9 Drawing Sheets

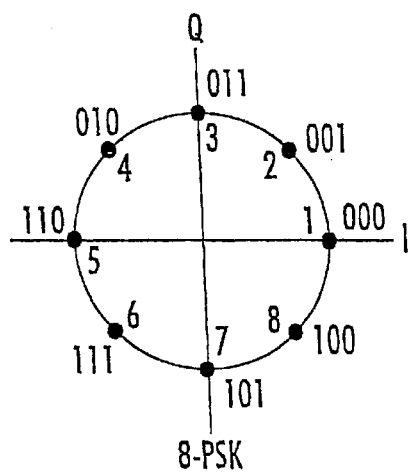
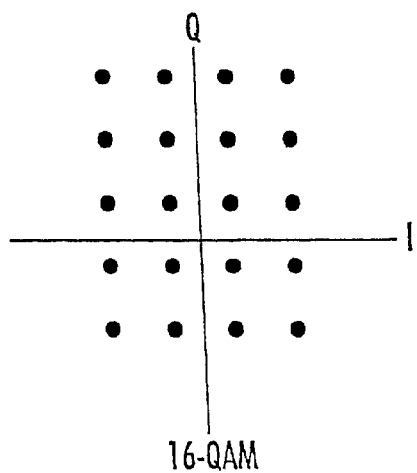
FIG. 5A.
*(PRIOR ART)*
FIG. 5B.
*(PRIOR ART)*
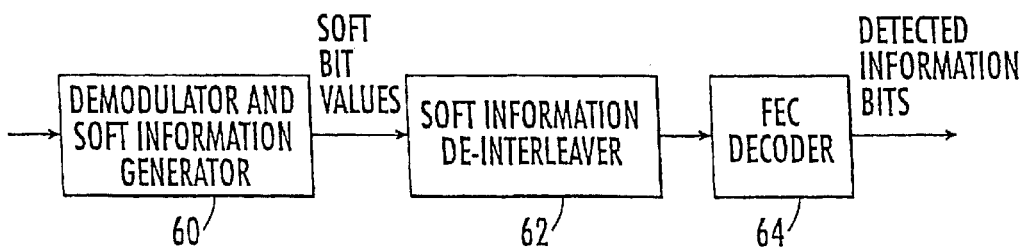
FIG. 6.
*(PRIOR ART)*
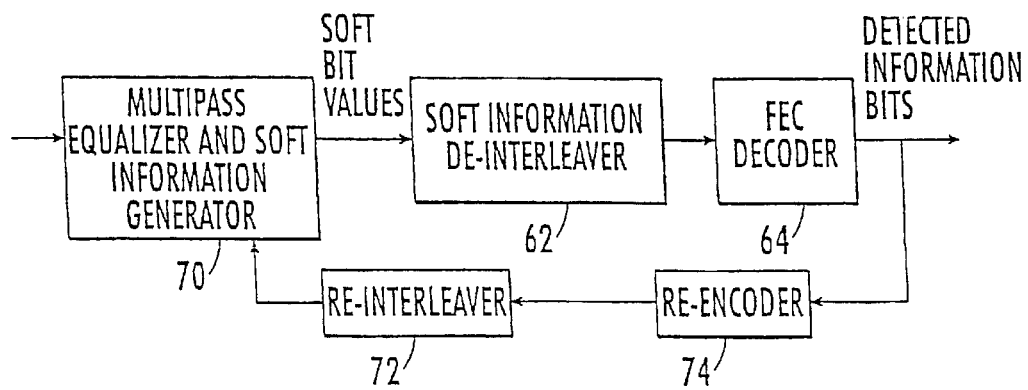
FIG. 7.
*(PRIOR ART)*

METHODS AND SYSTEMS FOR EXTRACTING A JOINT PROBABILITY FROM A MAP DECISION DEVICE AND PROCESSING A SIGNAL USING THE JOINT PROBABILITY INFORMATION

RELATED APPLICATIONS

This Application is a continuation-in-part of U.S. patent application Ser. No. 09/587,995, now U.S. Pat. No. 6,697,441, entitled "Baseband Processors and Methods and Systems for Decoding a Received Signal Having a Transmitter or Channel Induced Coupling Between Bits," filed Jun. 6, 2000 which is incorporated herein by reference as if set forth in its entirety.

BACKGROUND OF THE INVENTION

The present invention relates to signal communications and, in particular, to soft information related to signals received over a communications channel.

One type of communications channel which is expanding particularly rapidly is wireless communications, particularly as more radio spectrum becomes available for commercial use and as cellular phones become more commonplace. In addition, analog wireless communications are gradually being supplemented and even replaced by digital communications. In digital voice communications, speech is typically represented by a series of bits which may be modulated and transmitted from a base station of a cellular communications network to a mobile terminal device such as a cellular phone. The phone may demodulate the received waveform to recover the bits, which are then converted back into speech. In addition to voice communications, there is also a growing demand for data services, such as e-mail and Internet access, which typically utilize digital communications.

There are many types of digital communications systems. Traditionally, frequency-division-multiple-access (FDMA) is used to divide the spectrum up into a plurality of radio channels corresponding to different carrier frequencies. In time division multiple access (TDMA) systems, carriers may be divided into time slots, as is done, for example, in the digital advanced mobile phone service (D-AMPS) and the global system for mobile communication (GSM) standard digital cellular systems. Alternatively, multiple users can use a common range of frequencies using spread-spectrum techniques as is typically done in code-division multiple-access (CDMA).

A typical digital communications system 19 is shown in FIG. 1. Digital symbols are provided to the transmitter 20, which maps the symbols into a representation appropriate for the transmission medium or channel (e.g. radio channel) and couples the signal to the transmission medium via antenna 22. The transmitted signal passes through the channel 24 and is received at the antenna 26. The received signal is passed to the receiver 28. The receiver 28 includes a radio processor 30, a baseband signal processor 32, and a post processing unit 34.

The radio processor 30 typically tunes to the desired band and desired carrier frequency, then amplifies, mixes, and filters the signal to a baseband. At some point the signal may be sampled and quantized, ultimately providing a sequence of baseband received samples. As the original radio signal generally has in-phase (I) and quadrature (Q) components, the baseband samples typically have I and Q components, giving rise to complex, baseband samples.

The baseband processor 32 may be used to detect the digital symbols that were transmitted. It may produce soft information as well, which gives information regarding the likelihood of the detected symbol values. The post processing unit 34 typically performs functions that depend on the particular communications application. For example, it may convert digital symbols into speech using a speech decoder.

A typical transmitter is shown in FIG. 2. Information bits, which may represent speech, images, video, text, or other content material, are provided to forward-error-correction (FEC) encoder 40, which encodes some or all of the information bits using, for example, a convolutional encoder. The FEC encoder 40 produces coded bits, which are provided to an interleaver 42, which reorders the bits to provide interleaved bits. These interleaved bits are provided to a modulator 44, which applies an appropriate modulation for transmission. The interleaver 42 may perform any of a number of types of interleaving. One example is block interleaving, which is illustrated in FIG. 3. Conceptually, bits are written into rows of a table, then read out by column. FIG. 3 shows an example of 100 bits, written into a 10×10 table.

Another example of interleaving is diagonal interleaving, in which data from different frames are interleaved together. Diagonal interleaving is illustrated in FIG. 4. Each frame is block interleaved using block interleavers 50a, 50b, and 50c. Using switches 52a, 52b, and 52c, interleaved bits from each frame are split into two groups. The multiplexors 54a and 54b combine groups of bits from different frames to form transmit frames. In TDMA systems, different transmit frames generally would be sent in different time slots.

Referring again to FIG. 2, the modulator 44 may apply any of a variety of modulations. Higher-order modulations, such as those illustrated in FIGS. 5A and 5B, are frequently utilized. One example is 8-PSK (eight phase shift keying), in which 3 bits are sent using one of 8 constellation points in the in-phase (I)/quadrature (Q) (or complex) plane. In FIG. 5A, 8-PSK with Gray coding is shown in which adjacent symbols differ by only one bit. Another example is 16-QAM (sixteen quadrature amplitude modulation), in which 4 bits are sent at the same time as illustrated in FIG. 5B. Higher-order modulation may be used with conventional, narrow-band transmission as well as with spread-spectrum transmission.

A conventional baseband processor is shown in FIG. 6. A baseband received signal is provided to the demodulator and soft information generator 60 which produces soft bit values. These soft bit values are provided to the soft information de-interleaver 62 which reorders the soft bit values to provide de-interleaved soft bits. These de-interleaved soft bits are provided to the FEC decoder 64 which performs, for example, convolutional decoding, to produce detected information bits.

A second example of a conventional baseband processor is shown in FIG. 7. This processor employs multipass equalization, in which results, after decoding has completed, are passed back to the equalization circuit to re-equalize, and possibly re-decode, the received signal. Such a system is described, for example, in U.S. Pat. No. 5,673,291 to Dent et al. entitled "Simultaneous demodulation and decoding of a digitally modulated radio signal using known symbols" which is hereby incorporated herein by reference. For the circuit illustrated in FIG. 7, the processor typically initially performs conventional equalization and decoding. After decoding, the detected information bits are re-encoded in the re-encoder 74 and then re-interleaved in the re-interleaver 72 to provide information to the multipass equalizer and soft information generator 70 which re-equalizes the received baseband signal using the detected bit values. Typically, because of diagonal interleaving or the fact that some bits are not convolutionally encoded, the second pass effectively uses error corrected bits, as determined and corrected in the first pass, to help detection of other bits, such as bits which were not error correction encoded.

Both single pass and multipass baseband processors as described above typically use conventional forward error correction (FEC) decoders. Conventional FEC decoders typically treat each soft bit value as if it were independent of all other values. For example, in a Viterbi decoder for convolutional codes, soft bit values are generally correlated to hypothetical code bit values and added. As the soft bit values typically correspond to loglikelihood values, adding soft values corresponds to adding loglikelihoods or multiplying probabilities. As the Viterbi decoder corresponds to maximum likelihood sequence estimation (MLSE) decoding, multiplying probabilities generally assumes that the noise on each bit value is independent.

For lower-order modulation, with Nyquist pulse shaping and nondispersive channels, independent noise is often a reasonable assumption. For example, for quadrature phase shift keyed (QPSK) modulation, one bit is generally sent on the I component and a second bit is sent on the Q component. Because noise is typically uncorrelated between the I and Q components, the noise on these two bits would generally be independent. However, with higher-order modulation, noise values on the different bits are generally not independent. Consider the 8-PSK example shown in FIG. 5A. As 3 bits are affected by only 2 independent noise values (I and Q noise components), the noise on the 3 soft bit values is expected to be correlated. Thus, with higher-order modulation, the conventional approaches to demodulation and decoding ignore the fact that bit soft values may be related through correlated noise. As a result, performance may be reduced.

In a more general sense, bit likelihoods may be coupled in many ways. For 8-PSK with Nyquist pulse shaping, groups of 3 bits are generally coupled by the modulation. With partial response pulse shaping, overlapping groups of bits may be coupled through the pulse shape. Differential modulation may also couple successive symbols. Bit coupling may also be introduced by the communication channel. For example, bit coupling may result from multipath time dispersion, in which symbols overlap with one another. Such overlap may result due to signal echoes.

Bit interdependence is generally present in a variety of standard protocols. For IS-136, which uses differential QPSK (DQPSK) modulation, Gray mapping is typically used to map bit pairs to so-called differential symbols, and, as a result, the two bits generally have a low interdependence. However, there is typically an interdependence between bits from adjacent symbol periods. Accordingly, multi-pass demodulation/decoding structures as described above may work well in such an environment even in non-dispersive channels.

By way of further example, the Enhanced Data Rates for Global Evolution (EDGE) system generally uses Gray mapping from triplets to 8-PSK symbols. As a result of the Gray mapping, low interdependence among bits mapping into the same symbol will typically be encountered. However, the modulator used for EDGE systems typically has a heavy partial response, and the short symbol period often makes the intersymbol interference (ISI) arising from time dispersion in the physical medium significant. As a result, a high interdependence among bits from a few neighboring symbol periods may be found.

As a further example, the Global System for Mobile communications (GSM) typically uses non-linear modulation which can be approximated by a binary linear modulator with a heavy partial response. Again, in such a system, high interdependence among bits from a few neighboring symbol periods would be expected. Thus, bit interdependence can be present in a communication system even when the mapping to symbols is chosen to lower such bit interdependence so long as information across symbols is utilized in finding bit interdependence.

One problem which may be encountered with multi-pass techniques, such as those described above, is that the re-use of the demodulator may be wasteful. For example, in many systems, such as IS-136, GSM and EDGE, the demodulator is typically an equalizer whose main task is to deal with the cumulative ISI due to the transmitter, the physical medium and the receiver. In addition, the equalizer typically conducts adjunct tasks, such as channel tracking (for example, in IS-136), noise whitening (for example, in EDGE), automatic frequency correction (AFC) and so on. Thus, the equalizer typically performs complex operations which tend to dominate the overall complexity of the baseband processor. While various of the adjunct tasks could potentially be disabled in multi-pass processing, the primary ISI task typically cannot be turned off and, thus, creates a source of waste in a second or subsequent processing pass through the equalizer. If the ISI is successfully dealt with in the first pass of the equalizer, little advantage results from addressing ISI repeatedly in subsequent passes. In addition, the necessity for storing data required to re-run the equalizer may also create problems. For example, in EDGE, the decoder typically accepts data from four bursts, thus requiring the received values for the four bursts to be stored in order to iterate between the decoder and the equalizer.

SUMMARY OF THE INVENTION

In embodiments of the present invention, methods and devices for extracting a joint probability from a maximum a posteriori (MAP) decision device are provided. Probability information associated with a first symbol and a second symbol is obtained from the MAP decision device. A joint probability of the first symbol and the second symbol is determined from the probability information associated with the first symbol and the second symbol. Methods and devices for processing a signal containing information associated with a plurality of transmitted bits using the generated joint probability information are also provided. The MAP decision device in various embodiments is a demodulator or a decoder.

BRIEF DESCRIPTION OF THE DRAWINGS

FIG. 5A is a graphical illustration of an 8-PSK modulation constellation;

FIG. 5B is a graphical illustration of a 16-QAM modulation constellation;

FIG. 6 is a block diagram illustrating a conventional baseband processor;

FIG. 7 is a block diagram illustrating a conventional multipass baseband processor;

DETAILED DESCRIPTION OF THE INVENTION

Figure 1:
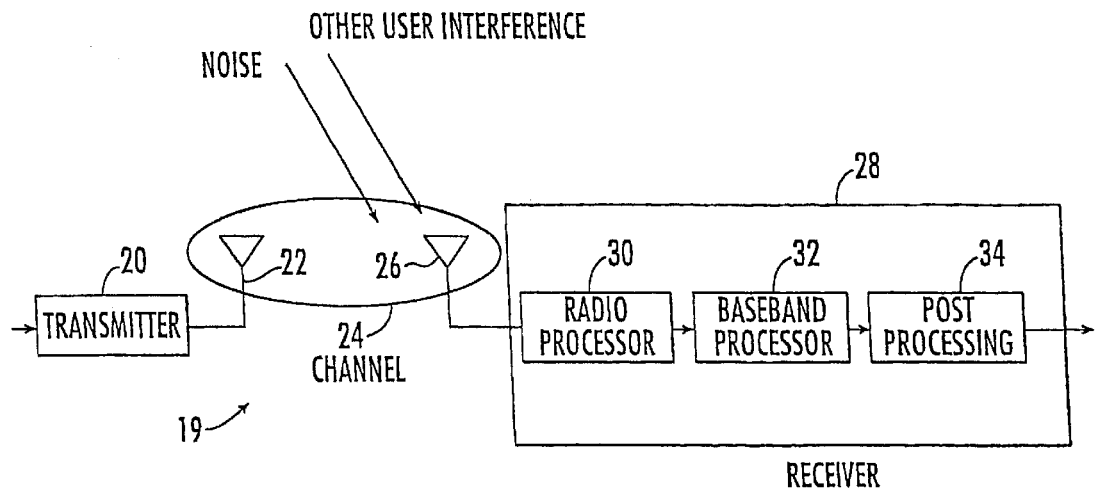
FIG. 1 is a block diagram illustrating a conventional communication system.
Figure 2:
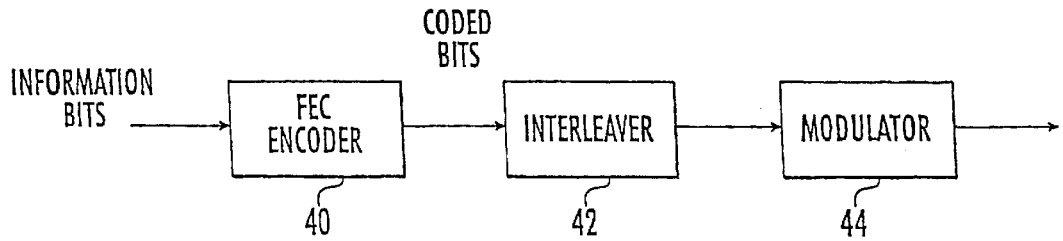
FIG. 2 is a block diagram illustrating a conventional transmitter.
Figure 3:
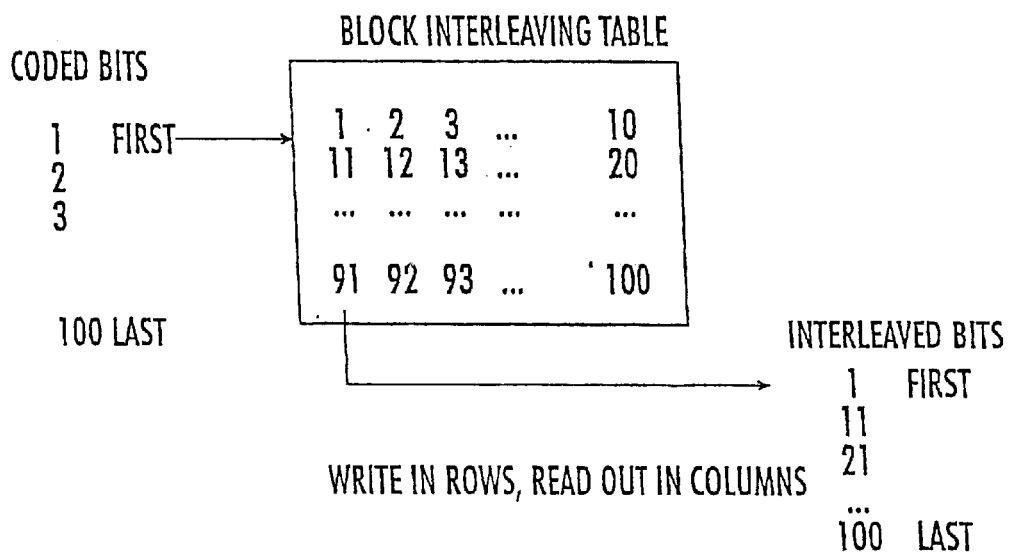
FIG. 3 is a schematic diagram illustrating an exemplary conventional block interleaving circuit.
Figure 4:
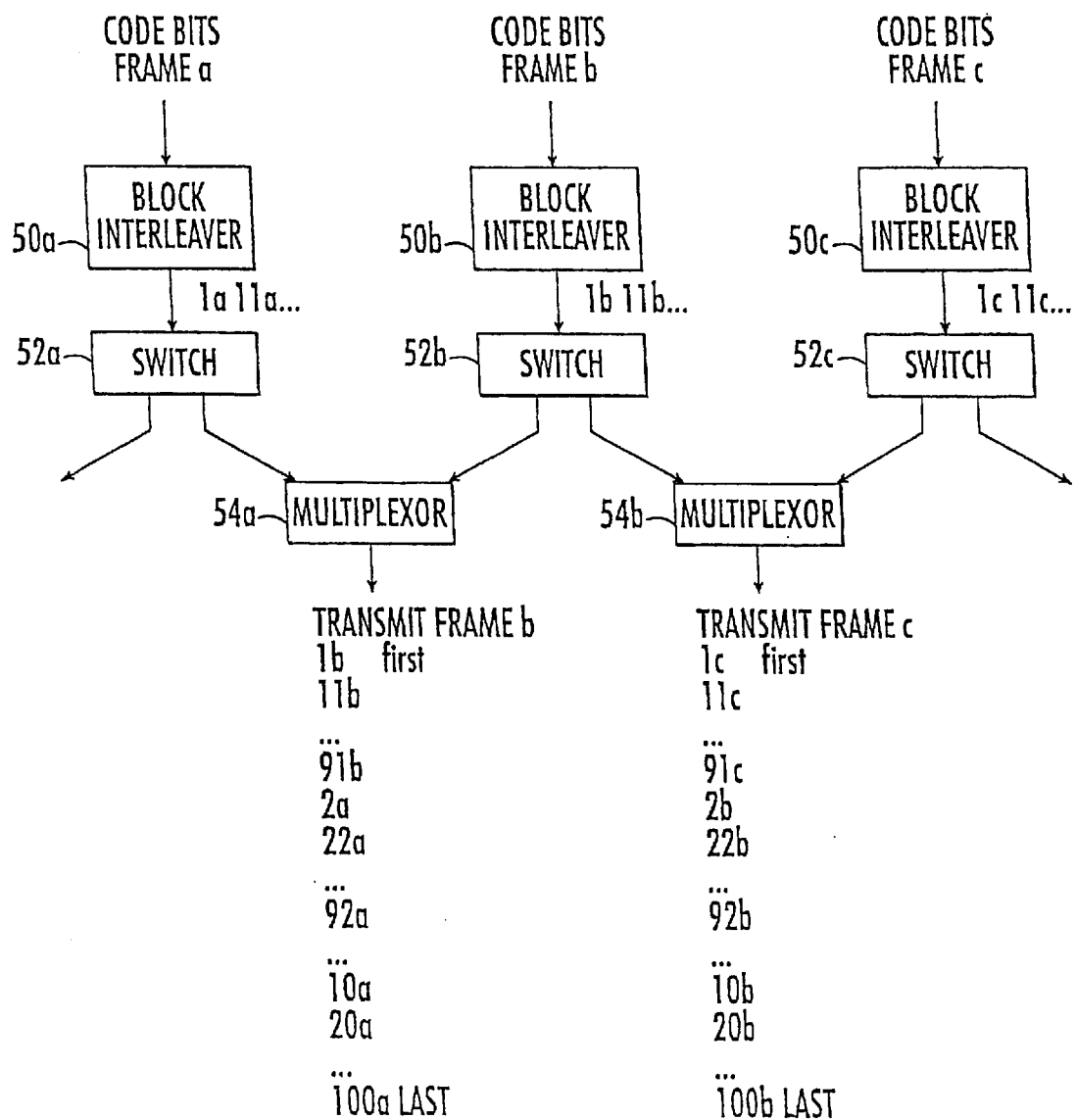
FIG. 4 is a block diagram illustrating an exemplary conventional diagonal interleaving circuit.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. As will be appreciated by those of skill in the art, the present invention may be embodied as methods or devices. Accordingly, the present invention may take the form of a hardware embodiment, a software embodiment or an embodiment combining software and hardware aspects.

As will be described below, embodiments of the present invention provide methods and devices for extracting a joint probability from a MAP decision device. Probability information associated with a first symbol and a second symbol is obtained from the MAP decision device. A joint probability of the first symbol and the second symbol is determined from the probability information associated with the first symbol and the second symbol.

In various embodiments of the present invention, the probability information associated with the first symbol and the second symbol includes a branch probability, a forward state probability and a backward state probability. The MAP decision device may operate on a trellis and the joint probability of the first symbol at a (k−n)-th stage of the trellis, where n is at least one, and the second symbol at a k-th stage of the trellis are determined from the probability information associated with the first symbol and the second symbol. In particular embodiments, n equals one.

In further embodiments of the present invention, the probability information associated with a first symbol and a second symbol is obtained from the MAP decision device by calculating forward state probabilities through the (k−n)-th stage of the trellis. In addition, backward state probabilities through the k-th stage of the trellis are calculated and branch probabilities are calculated between a state at the (k−n)-th stage of the trellis and a state at the k-th stage of the trellis. Operations in such embodiments for determining the joint probability include selecting an i-th information symbol at the (k−n)-th stage of the trellis as the first symbol and a j-th information symbol at the k-th stage of the trellis as the second symbol and determining a joint probability of the first symbol and the second symbol from the calculated forward state probabilities, reverse state probabilities and branch probabilities based on the selected i-th information symbol and j-th information symbol.

More particularly, the joint probabilities may be calculated by selecting branch paths having an i-th symbol label of a branch from the (k−n)-th stage corresponding to the selected i-th information symbol and a j-th symbol label of a branch into the k-th stage corresponding to the selected j-th information symbol, generating a product of an associated forward state probability, backward state probability and branch probability for each of the selected branch paths, and summing the generated products to provide the joint probability of the first symbol and the second. In particular embodiments, the branch probability is calculated by calculating channel information based probability and prior information about a branch based probability information and combing the channel information based probability and prior information about a branch based probability to provide a branch probability for a branch.

The MAP decision device may be a demodulator, such as an equalizer, or a decoder. The symbol may be a bit.

In other embodiments of the present invention, methods are provided for processing a signal containing information associated with a plurality of transmitted bits, the signal being received over a channel from a transmitter. The signal is demodulated to provide demodulated received symbols. The demodulated received symbols are decoded to provide estimates of the transmitted bits. Either demodulating or decoding includes generating joint probability information from a MAP decision device. The joint probability information is used during either demodulating or decoding to provide the estimates of the transmitted bits. The joint probability information is generated from a MAP decision device by selecting a first one of the received symbols and a second one of the received symbols. The first symbol and the second symbol are selected to be expected to have a joint probability different from the product of their respective symbol probabilities. Probability information associated with the first symbol and the second symbol is obtained from the MAP decision device and a joint probability of the first symbol and the second symbol is determined from the obtained probability information associated with the first symbol and the second symbol. The transmitted bits, including ones associated with the first symbol and the second symbol, may be coded, interleaved and modulated for transmission as the signal.

In further embodiments of the present invention, demodulating the received symbols includes generating joint probability information associated with the first and the second symbol from a MAP demodulator. In such embodiments, decoding the demodulated received symbols may further include fixed-lag decoding the received symbols to provide adjusted probability information associated with one of the first and the second symbol based on probability information about the other of the first and the second symbol generated during decoding and the joint probability information associated with the first and the second symbol from demodulating.

In yet other embodiments of the present invention, decoding the demodulated received symbols further includes generating joint probability information associated with the first and the second symbol from a MAP decoder. In such embodiments, decoding the demodulated received symbols may be followed by re-demodulating the received symbols to provide adjusted demodulated received symbols based on the joint probability information associated with the first and the second symbol from decoding.

In yet further embodiments of the present invention, decoding the demodulated received symbols further includes turbo decoding the demodulated received symbols, the turbo decoding including a first decoding separated by an interleaving and a second decoding. In such embodiments, turbo decoding the demodulated received symbols may further include generating joint probability information associated with the first and the second symbol from the first decoding for use in the second decoding and from the second decoding for use in the first decoding.

In still other embodiments of the present invention, a plurality of the transmitted bits, including ones associated with the first symbol and the second symbol, are transmitted with inner modulation and an outer code. The inner modulation in such embodiments may display a correlation and the outer code may be selected to correspond to a correlated modulation block of the inner modulation. More particularly, in various such embodiments, the inner modulation is 8-PSK having two consecutive correlated symbols and the outer code has an alphabet including 64 letters. In such embodiments, generating joint probabilities information may include generating 64 joint probabilities for consecutive symbol pairs and using the generated joint probabilities as letter probabilities for decoding the outer code. The transmitted bits may be interleaved for transmission and code letters of the outer code may be scrambled without breaking the code letters up.

In still further embodiments of the present invention, MAP decision devices providing joint probability information are provided. An intermediate value output circuit generates probability information associated with a first symbol and a second symbol being processed by the MAP decision device. A joint probability calculation circuit generates a joint probability of the first symbol and the second symbol from the probability information associated with the first symbol and the second symbol.

In other embodiments of the present invention, receiver devices are provided for processing a signal containing information associated with a plurality of transmitted bits, the signal being received over a channel from a transmitter. The receiver device includes a signal processor that receives the signal. A demodulator demodulates the received signal to provide demodulated received symbols and a decoder decodes the demodulated received symbols to provide estimates of the transmitted bits. One of the demodulator and the decoder is a MAP decision device providing joint probability information. The MAP decision device includes an intermediate value output circuit that generates probability information associated with a first symbol and a second symbol being processed by the MAP decision device and a joint probability calculation circuit that generates a joint probability of the first symbol and the second symbol from the probability information associated with the first symbol and the second symbol. The generated joint probability is used by the demodulator and/or the decoder to provide the estimates of the transmitted bits.

The receiver device may be a wireless terminal, a base station or a mobile switching center receiving the transmitted signal. The first symbol and the second symbol may have a joint probability different from a product of their respective symbol probabilities. The first symbol and the second symbol may have a coupling introduced by at least one of the transmitter and the channel.

A joint probability may be a probability across more than two symbols. Accordingly, while the present invention will generally be described herein with reference to a first and second symbol, it is to be understood that use of a joint probability across three or more symbols is within the scope of the present invention.

The present invention will first be described with reference to the block diagram illustration of FIG. 8 which depicts an embodiment of a MAP decision device according to the present invention. It is to be understood that MAP decision devices of the present invention may be utilized in a variety of communication devices, including wireless communication devices such as wireless mobile terminals. Such a mobile terminal may include a transmitter, a receiver, a user interface and an antenna system. In some embodiments of the present invention, the antenna system may include an antenna feed structure and one or more antennas. The antenna system may be coupled to a MAP decision device through signal processor circuitry, such as an RF processor, configured to step up signals for transmission to an assigned transmission frequency or to step down received signals from a modulation frequency to a baseband frequency. However, a MAP decision device in some embodiments of the present invention may couple directly to an antenna system.

By way of background, the transmitter typically converts the information which is to be transmitted by the mobile terminal into an electromagnetic signal suitable for radio communications. The receiver demodulates electromagnetic signals which are received by the mobile terminal so as to provide the information contained in the signals to the user interface in a format which is understandable to the user. The receiver generally includes an RF processor and a baseband processor. In particular, a MAP decision device of the present invention may be beneficially utilized as a baseband processor as will be further described herein. A wide variety of transmitters, receivers, and user interfaces (e.g., microphones, keypads, displays) which are suitable for use with handheld radiotelephones are known to those of skill in the art, and such devices may be implemented in a radiotelephone including a baseband processor in accordance with the present invention. Other than the MAP decision device according to the present invention, the design of such a radiotelephone is well known to those of skill in the art and will not be further described herein. It is further to be understood that the present invention is not limited to radiotelephones and may also be utilized with other wireless and wired communication receivers and further for communications with computer storage medium, such as magnetic storage devices, to extract data.

The present invention is generally described herein in the context of a wireless terminal. As used herein, the term "wireless terminal" may include, but is not limited to, a cellular radiotelephone with or without a multi-line display; a Personal Communications System (PCS) terminal that may combine a cellular radiotelephone with data processing, facsimile and data communications capabilities; a PDA that can include a radiotelephone, pager, Internet/intranet access, Web browser, organizer, calendar and/or a global positioning system (GPS) receiver; and a conventional laptop and/or palmtop receiver or other appliance that includes a radiotelephone transceiver. Wireless terminals may also be referred to as "pervasive computing" devices and may be mobile terminals.

The present invention provides methods and systems which may be used to extract information from a first pass through an equalizer which information may be used without tying up the equalizer itself in interaction with the decoder. This extracted information may be an appropriately selected set of joint bit probabilities that can be derived from the equalizer in addition to standard bit-by-bit reliability information. The selection of which joint bit probabilities to determine may be based on knowledge about bit dependence (interdependence). For example, if two bits are highly dependent, then their joint probability may convey information not conveyed by their individual bit probabilities. Thus, MAP decision devices according to the present invention may provide for iterating between the joint probabilities and the decoder. Alternatively, the decoder may generate the joint probability information for use by either the equalizer or the decoder. Such operations may be viewed by considering joint probability as effectively representing a higher order modulation constellation or a (short) binary block code.

U.S. patent application Ser. No. 09/587,995 entitled "Baseband Processors and Methods and Systems for Decoding a Received Signal Having a Transmitter or Channel Induced Coupling Between Bits," now U.S. Pat. No. 6,697,441, which was incorporated by reference above, describes what may be considered feed forward decoding methods and systems which may be capable of exploiting joint bit probabilities to boost performance. Unlike the multi-pass techniques discussed previously herein, such feed forward decoding may be provided as a single pass operation which extracts knowledge from earlier stages of decoding and feeds such information forward to help later stages. For example, suppose bits $Y_A$ and $Y_B$ are dependent, and that $Y_A$ occurs in an early stage of the decoder whereas $Y_B$ occurs in a late stage. The coder may then produce new knowledge about $Y_A$ before it reaches $Y_B$ during processing. It may thus combine such knowledge and the joint probability of $Y_A$ and $Y_B$ to produce new knowledge about $Y_B$ which may be used once it reaches $Y_B$. Examples are presented in application Ser. No. 09/587,995 with particular reference to convolutional codes and 8-PSK modulation with natural mapping.

By way of background to understanding the present invention, MAP decision devices as generally described in L. R. Bahl, J. Cocke, F. Jelinek, and J. Raviv, "Optimal decoding of linear codes for minimizing symbol error rate," *IEEE Trans. Inform. Theory.*, pp. 284–287, March 1974 (the BCJR article) will now be described. Such devices are often referred to as "BCJR" devices by those of skill in the art. For purposes of this discussion the MAP decision device will be described with reference to a decoder but the discussion also applies to a MAP demodulator such as an equalizer. In the demodulator case, symbols may correspond to a modulator interval. For example, with 8PSK modulation, a symbol typically corresponds to one of eight phase choices. In the decoder case, a symbol generally corresponds to a letter from a finite alphabet. For example, a binary code uses bits as symbols. It is further to be understood that the term "MAP decision device" as used herein is not limited to BCJR devices but refers more generally to devices providing intermediate symbol (such as bit) soft information. For example, a maximum likelihood sequence estimation (MLSE) algorithm, such as a Soft Output Viterbi algorithm, can be used to approximate a MAP approach and may be a MAP decision device as that term is used herein. Another such approach providing a MAP decision device as used herein would be based on a decision feedback sequence estimation (DFSE).

The MAP decoder of the BCJR article operates over a trellis. The trellis can be very general, for example, with a time-varying structure, and the description here does not preclude such generality but is merely presented to facilitate understanding. However, it is helpful to reference a well-behaved trellis such as that derived from a convolutional code, a partial response linear modulation, or an ISI channel.

At each stage of the trellis, there are branches connecting starting states to ending states. For each state s, the fan-in I(s) contains the states with branches ending in s, and the fan-out O(s) contains the states with branches starting in s. For simplicity, assume that there can be no more than one branch starting in one state s' and ending in some state s. That is the intersection of O(s') and I(s) for any states s' and s either is empty or contains a single branch. Such a branch is represented by the pair (s', s). The trellis has L+1 stages. Without much loss of generality, assume that the trellis is terminated on both ends, and that the initial state and the ending state are both known and set to 0. Each branch (s', s) has an input label, consisting of an N-tuple of information bits, and an output label, which may consist of an M-tuple of code bits, a symbol from a modulation constellation, a synthesized received value reflecting the channel ISI, and so on.

At the output of the channel, the decoder processes L+1 received values, denoted $r_0^L$, to produce estimates of the transmitted information bits. At the k-th stage of the trellis, for each branch (s', s), the received value $r_k$ is used to compute the probability.

$$P(r_k | \sigma_{k-1}=s', \sigma_k=s) \quad (1)$$

where P is the probability of $r_k$ given a state at k−1 ($\sigma_{k-1}$) of s' and a state at k ($\sigma_k$) of s. This represents the knowledge provided by the channel at time k. In an additive white gaussian noise (AWGN) channel, for example, Equation 1 may have the familiar exponential form.

Given all the branch probabilities, the intermediate probability $P(\sigma_{k-1}=s', \sigma_k=s, r_0^L)$ can be obtained. It serves as a basis for useful knowledge that can be extracted from the trellis. The fundamental relation described in the BCJR article may be expressed as follows:

$$P(\sigma_{k-1} = s', \sigma_k = s, r_0^L) = P(\sigma_{k-1} = s', r_0^{k-1}) \cdot \quad (2)$$
$$P(r_k | \sigma_{k-1} = s', \sigma_k = s) \cdot P(\sigma_k = s | \sigma_{k-1} = s') \cdot P(r_{k+1}^L | \sigma_k = s)$$

The first term in Equation 2 can be obtained using a forward recursion over the trellis. Similarly, the last term can be obtained using a backward recursion over the trellis. They are identified as:

$$P(\sigma_{k-1}=s', r_0^{k-1})=\alpha_{k-1}(s') \quad (3)$$

for the forward recursion, and $$P(r_{k+1}^L | \sigma_{k-1}=s', \sigma_k=s)=\beta_k(s) \quad (4)$$

for the backward recursion. The middle product is identified as $$P(r_k|\sigma_{k-1}=s', \sigma_k=s) \cdot P(\sigma_k=s|\sigma_{k-1}=s')=\gamma_k(s', s) \quad (5)$$

The first term in Equation 5 represents the channel, and the second term represents any prior information about the branch (s', s), including its absence from the trellis, in which case $P(\sigma_k=s|\sigma_{k-1}=s')=0$.

The forward recursion is given by $$a_k(s) = \sum_{s' \in I(s)} a_{k-1}(s') \cdot \gamma_k(s', s) \quad (6)$$

where $s' \in I(s)$ is the set of states that correspond to the fan-in of s. The backward recursion is given by $$\beta_{k-1}(s) = \sum_{s \in O(s')} \beta_k(s) \cdot \gamma_k(s', s) \qquad (7)$$

where $s \in O(s')$ is the set of states that correspond to the fan-out of s'. The initial conditions are given by $$\alpha_0(0)=1, \text{ and } \alpha_0(s)=0, s \neq 0 \qquad (8)$$

$$\beta_L(0)=1, \text{ and } \beta_L(s)=0, s \neq 0 \qquad (9)$$

To summarize, the fundamental relation may be re-written as:

$$P(\sigma_{k-1}=s', \sigma_k=s, r_0^L) = \alpha_{k-1}(s') \cdot \gamma_k(s',s) \cdot \beta_k(s) \qquad (10)$$

The combining operation thus uses the forward and backward recursions and the branch metrics to produce the probability $P(x_{k,i}, r_0^L)$ where $x_{k,i}$ is the i-th information bit at stage k. The set $B(x_{k,i})$ contains the branches (s', s) at stage k whose i-th bit label is equal to $x_{k,i}$. Then:

$$P(x_{k,i}, r_0^L) = \sum_{(s',s) \in B(x_{k,i})} P(\sigma_{k-1}=s', \sigma_k=s, r_0^L) \qquad (11)$$

$$= \sum_{(s',s) \in B(x_{k,i})} \alpha_{k-1}(s') \cdot \gamma_k(s',s) \cdot \beta_k(s)$$

where $(s',s) \in B(x_{k,i})$ is the set of state transitions corresponding to the ith information bit at stage k being equal to $x_{k,i}$. Often the log-likelihood ratio is the desired quantity, which can be written as:

$$\lambda_{k,i} = \log\left(\frac{P(x_{k,i}=0 \mid r_0^L)}{P(x_{k,i}=1 \mid r_0^L)}\right) \qquad (12)$$

$$= \log\left(\frac{P(x_{k,i}=0, r_0^L)}{P(x_{k,i}=1, r_0^L)}\right)$$

where the numerator and the denominator can be computed from Equation 11.

In light of this mathematical expression of a MAP decision device, operations for finding joint probabilities according to embodiments of the present invention will now be described. Having computed the branch probabilities and the forward and backward state probabilities, the present invention recognizes that it is possible to extract joint bit probabilities in addition to single bit probabilities. In particular, a joint probability for $x_{k-1,i}$, the i-th information bit at stage k−1, and $x_{k,j}$, the j-th information bit at stage k may be determined. The triplet (s", s', s) represents 2 consecutive branches (s",s') at stage k−1 and (s', s) at stage k. We can extend the fundamental relation of Equation 2 to express the probability of this triplet as:

$$P(\sigma_{k-2}=s'', \sigma_{k-1}=s', \sigma_k=s, r_0^L) = \qquad (13)$$

$$P(\sigma_{k-2}=s'', r_0^{k-2}) \cdot P(r_{k-1} \mid \sigma_{k-2}=s'', \sigma_{k-1}=s') \cdot$$

$$P(\sigma_{k-1}=s' \mid \sigma_{k-2}=s'') \cdot P(r_k \mid \sigma_{k-1}=s', \sigma_k=s) \cdot$$

$$P(\sigma_k=s \mid \sigma_{k-1}=s') \cdot P(r_{k+1}^L \mid \sigma_k=s)$$

By identifying the appropriate terms for Equations 3, 4, and 5, Equation 13 can be rewritten as:

$$P(\sigma_{k-2}=s'', \sigma_{k-1}=s', \sigma_k=s, r_0^L) = \alpha_{k-2}(s'') \cdot \gamma_k(s', s) \cdot \beta_k(s) \qquad (14)$$

The joint bit probability can be computed from Equation 14. The set $B(x_{k-1,i}, x_{k,j})$ contains the triplet (s", s', s) such that the i-th bit label of (s",s') is equal to $x_{k-1,i}$, and the j-th bit label of (s',s) is equal to $x_{k,j}$. Then, using Equation 14, the joint probability can be expressed as:

$$P(x_{k-1,i}, x_{k,j}, r_0^L) = \qquad (15)$$

$$\sum_{(s'',s',s) \in B(x_{k-1,i}, x_{k,j})} \alpha_{k-2}(s'') \cdot \gamma_{k-1}(s'', s') \cdot \gamma_k(s', s) \cdot \beta_k(s)$$

where $(s'',s',s) \in B(x_{k-1,i}, x_{k,j})$ is the set of state transitions such that the i-th bit at stage k−1=$x_{k-1,i}$ and the j-th bit at stage k=$x_{k,j}$. This joint probability is expected to contain useful additional bit information if:

$$P(x_{k-1,i}, x_{k,j} \mid r_0^L) \neq P(x_{k-1,i} \mid r_0^L) \cdot P(x_{k,j} \mid r_0^L) \qquad (16)$$

If the labels on the branches consist of multiple bits, then it may be desirable to compute joint probabilities for more than two bits. For example, 8 PSK modulation typically results in three bit labels per branch. This is achieved by defining the set B which constrains Equation 15 appropriately. In particular, let B $(x_{k-1,\ i}, x_{k-1,\ i'}, x_{k,j}, x_{k,j'})$ contain the triplets (s", s', s) such that the i-th and i'-th labels of (s", s') are equal to $x_{k-1,\ i}$ and $x_{k-1,\ i'}$ respectively and the j-th and j'-th labels of (s',s) are equal to $x_{k,j}$ and $x_{k,j'}$ respectively. Then we can express the joint probability of the four bits as:

$$P(x_{k-1}, x_{k-1}, x_{k,j}, x_{k,j}) = \qquad (17)$$

$$\sum_{(s'',s',s) \in B(x_{k-1,i}x_{k-1,i'}, x_{k,j}x_{k,j})} \alpha_{k-2}(s'') \gamma_{k-1}(s'', s') \gamma_k(s', s) \beta_k(s)$$

More generally, it is possible to extend the probability of a triplet to any length sequence of states, using the same principles that yield Equation 13. For instance, the probability of a quadruplet (s''', s", s', s) representing consecutive branches (s''', s"), (s", s') and (s', s) at stages k−2, k−1 and k, respectively, can be written as:

$$P(\sigma_{k-3}=s''', \sigma_{k-2}=s'', \sigma_{k-1}=s', \sigma_k=s, r_0^L) = \alpha_{k-}(s''') \gamma_{k-2}(s''', s'') \gamma_{k-1}(s'', s') \gamma_k(s', s) \beta_k(s) \qquad (18)$$

Using Equation 18, it is possible to compute the joint probability of bits from stages k−2, k−1 and k. In particular, let $B(x_{k-2,\ i}, x_{k,j})$ contain the quadruplets (s''', s", s', s) such that the i-th bit label of (s''', s") is equal to $x_{k-2,\ i}$ and the j-th bit of (s', s) is equal to $x_{k,j}$. Then, using Equation 18, the joint probability can be expressed as:

$$P(x_{k-2,i}, x_{k,j}) = \qquad (19)$$

$$\sum_{(s''',s'',s',s) \in B(x_{k-2,i}x_{k,j})} \alpha_{k-3}(s''') \gamma_{k-2}(s''', s'') \gamma_{k-1}(s'', s') \gamma_k(s', s) \beta_k(s)$$

The joint probability of any number of bits labeling the three branches can be derived from Equation 18 by defining the set B which constrains Equation 19 appropriately.

Although the above formulation provides a mechanism for computing joint probabilities for bits from any locations on the trellis, most of the scenarios of interest exhibit the property that bit dependence is a local effect. That is, bits from adjacent or closely spaced stages have a lot of dependence, but that dependence attenuates very quickly as the spacing increases. This is generally the case for many differential modulation schemes, partial response modulation schemes, and ISI channels.

With this mathematical description of various embodiments of the present invention in mind, the invention will now be described more generally with reference to the block diagram illustration of embodiments of MAP decision devices providing joint probability information illustrated in FIG. 8. The MAP decision device of FIG. 8 may be either a demodulator, such as an equalizer or DQPSK coherent detector, or a decoder that provides soft information about processed symbols. As used herein, a MAP decision device is a device which generates intermediate value soft information associated with a symbol such as information bits contained in a received signal. In various embodiments, the received signal may contain a plurality of transmitted bits which are coded, interleaved and modulated for transmission as the signal. However, the present invention is not limited to generation of joint probability information about such transmitted bits.

Figure 8:
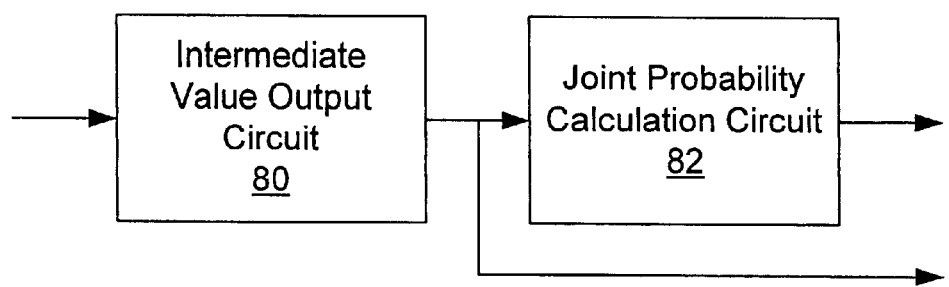
FIG. 8 is a block diagram illustrating a MAP decision device according to embodiments of the present invention.

Referring now to FIG. 8, the MAP decision device includes an intermediate value output circuit 80. The intermediate value output circuit 80 generates probability information associated with a first symbol and a second symbol being processed by the MAP decision device. As noted above, the first symbol and second symbol processed by the intermediate output circuit 80 may be transmitted binary bits. However, it is to be understood that the present invention is not limited to processing of intermediate information and joint probability information by bit processing but may also be applied to MAP decision devices processing symbols containing non-binary symbol sets. The MAP decision device as illustrated in FIG. 8 further includes a joint probability calculation circuit 82 that generates a joint probability of the first symbol and the second symbol from the probability information associated with the first symbol and the second symbol provided by the intermediate value output circuit 80.

As described previously, the probability information associated with the first symbol and the second symbol provided by the intermediate value output circuit 80 may include at least one of the branch probabilities, forward state probabilities and reverse state probabilities. The MAP decision device in various embodiments operates on a trellis which provides intermediate probability information at stages of the trellis. In such embodiments, the joint probability calculations circuit 82 may determine a joint probability of a first symbol at a (k−n)-th stage of the trellis and of a second symbol at a k-th stage of the trellis from the provided probability information associated with the individual bits. Preferably, n equals one, thus providing only a single trellis stage between the selected bit determination points allowing joint probability information to be determined using, for example, Equation 15. However, it is to be understood that the present invention is not so limited and may determine joint probability information utilizing bits selected at stages of the trellis more than a single stage separated and those of skill in the art will understand how to modify Equation 15 to accommodate such a selection.

Figure 9:
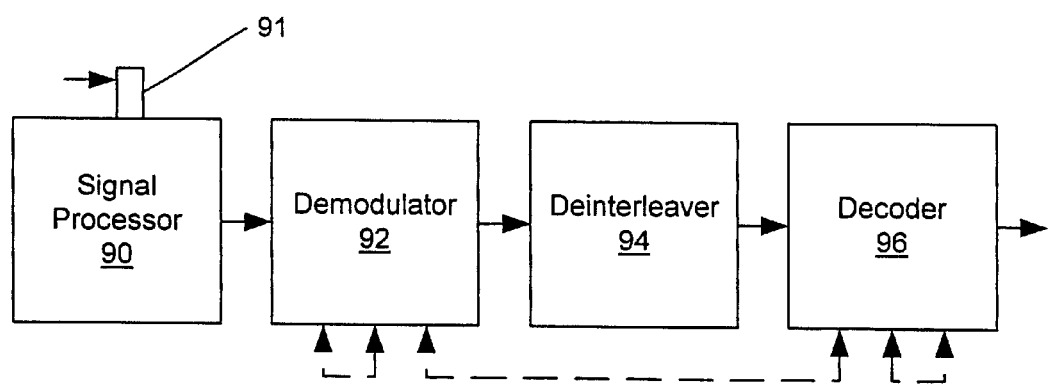
FIG. 9 is a block diagram illustrating a receiver device according to embodiments of the present invention.

Referring now to the schematic block diagram of FIG. 9, a system for processing a signal containing information associated with a plurality of transmitted bits received over a communication channel according to embodiments of the present invention is illustrated. A signal processor circuit 90 receives the signal. For example, the signal processor circuit 90 may be an RF processor receiving signals from an antenna 91 and stepping the signals down to a baseband. A demodulator 92 demodulates the received baseband signals. A decoder 96 decodes the demodulated received signals to provide estimates of the transmitted bits. An optional deinterleaver 94 is illustrated in FIG. 9 which may be utilized where bits received by the signal processor circuit 90 have been interleaved prior to transmission and modulation at a transmitter transmitting the bits.

Either the demodulator 92 or the decoder 96 is provided as a MAP decision device which determines joint probability information as described previously with reference to FIG. 8. As illustrated by the dotted arrows in FIG. 9, such joint probability information may be utilized within the decoder 96 or the demodulator 92, passed from the demodulator 92 to the decoder 96 or passed from the decoder 96 to the demodulator 92 in various embodiments as will be further described later herein.

Operations for extracting a joint probability from a MAP decision device according to embodiments of the present invention will now be generally described with reference to the flowchart illustration of FIG. 10. Probability information associated with a first symbol and a second symbol is obtained from a MAP decision device (block 100). A joint probability of the first symbol and the second symbol is determined from the probability information associated with the first symbol and the second symbol (block 105). As described previously with reference to FIG. 8, the MAP decision device may operate on a trellis, in which case operations at block 105 may include determining a joint probability of the first symbol at a (k−n)-th stage of the trellis, where n is at least 1, and the second symbol at a k-th stage of the trellis from the probability information associated with the first symbol and the second symbol. The first symbol and the second symbol may be a first bit and a second bit which may be selected based on a bit dependence between the first bit and the second bit.

Operations according to various embodiments of the present invention for extracting a joint probability from MAP decision device will now be further described with reference to the embodiments illustrated in FIG. 11. Operations associated with obtaining probability information for the first symbol and the second symbol will be first described with reference to blocks 110–114. At least one forward state probability is calculated through the (k−n)-th stage of the trellis (block 110). At least one backward state probability is calculated through the k-th stage of the trellis (block 112). At least one branch probability is calculated between a state at the (k−n)-th stage of the trellis and a state at the k-th stage of the trellis (block 114). As will be understood from Equations 10–15 above and from the operation of trellis type decision devices, depending upon the trellis structure of the decision device, a plurality of such probability information results associated with selected symbols (bits) will generally be calculated in connection with the calculation of each desired joint probability to be determined. This is illustrated, for example, by the summation set for the calculations utilized to generate a joint bit probability in Equation 15. However, in the interest in clarity in understanding the present invention, the particulars of this selection of the intermediate calculation values will not be further described herein as they will be understood by those of skill in the art in light of the disclosure provided herein.

Operations associated with determining a joint probability of the first symbol and the second symbol from the probability information associated with the first symbol and the second symbol will now be further described with reference to blocks 116–119. An i-th information symbol at the (k−n)-th stage of the trellis is selected as the first symbol and a j-th information symbol at the k-th stage of the trellis is selected as the second symbol (block 116). The selected i-th and j-th information symbol will be utilized in determining the necessary calculations for generating the joint probability information between the i-th and j-th information symbol. Preferably, the selected information symbols are selected based on a dependence relationship so that the joint probability information will provide information not otherwise available from probability information generated by the intermediate value output circuit 80 related to the respective individual information symbols. For example, the i-th and j-th information symbols (bits) may be selected based on a coupling of these information symbols introduced by either the communication channel over which they are transmitted or by the transmitter transmitting the symbols over the channel.

Branch paths having an i-th symbol label of a branch from the (k−n)-th stage corresponding to the selected i-th information symbol and a j-th symbol label of a branch into the k-th stage corresponding to the selected j-th information symbol are selected (block 117). A product of an associated forward state probability, backward state probability and branch probability for each of the selected branch paths is generated (block 118). The generated products are summed to provide the joint probability of the first symbol and the second symbol (block 119). As described with reference to the equations above, the branch probability may be provided by calculating a channel information based probability and prior information about a branch based probability for each selected branch and combining the channel information based probability information and prior information about a branch based probability to provide the branch probability for the selected branch.

Referring now to the flowchart diagram illustration of FIG. 12, operations for receiving a signal containing information associated with a plurality of transmitted bits, the signal being received over a channel from a transmitter, according to embodiments of the present invention will now be described. The signal is received to provide baseband received signals (block 120). The received symbols are demodulated (block 122). Note that, for the embodiments illustrated in FIG. 12, the received symbols are MAP demodulated where the demodulator is the MAP decision device. However, it is to be understood that the MAP decision device providing joint probability information in various other embodiments may be a MAP decoder, in which case the demodulator need not be a MAP demodulator providing intermediate bit probability information. As described with reference to FIG. 9, various interrelationships for usage of joint probability information between two bits to improve estimation of one of the bits and/or both of the bits during decoding and/or demodulating may be provided in accordance with the present invention which different approaches will be understood to operate similarly to the approach described herein with a MAP demodulator providing joint probability information to a decoder.

Referring again to FIG. 12, operations continue for generating joint probability information from the MAP demodulator as will now be described with reference to blocks 124–127. A first one of the received symbols and a second one of the received symbols which are expected to have a joint probability different from the product of their respective symbol probabilities, in other words, which are expected to have a dependence such as may be provided by the transmitting device or the channel over which the symbols are transmitted, are selected (block 124). Probability information associated with the first symbol and the second symbol is obtained from the MAP decision device (block 126). As described previously, this probability information may be intermediate bit probability information for the first bit and a second bit. A joint probability of the first symbol and the second symbol is determined from the obtained probability information associated with the first symbol and the second symbol (block 127). Various embodiments for determining such joint probability information have been described previously with reference to FIGS. 10 and 11 above and will not be further described herein. The demodulated received symbols are then decoded using the joint probability information to provide estimates of the transmitted bits (block 128).

Figure 13:
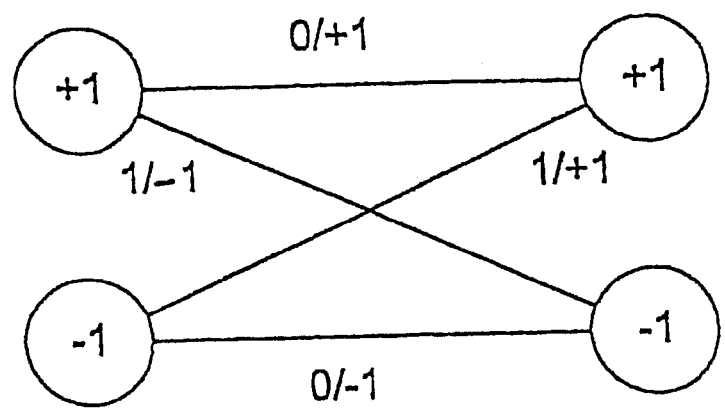
FIG. 13 is a schematic diagram illustrating a trellis stage of a MAP decision device.

Further explanation of the present invention will now be provided by way of example. More particularly, an example to illustrate the impact of joint probability knowledge will be provided. An information sequence X is encoded using a rate ½ convolutional encoder with a memory length of 4 bits. The encoder tags 4 zero tail bits and processes them to produce a code sequence Y. Then Y is interleaved with a square interleaver to produce Z, such that those code bits produced by the first half of X form $Z_A$ and those code bits produced by the second half of X form $Z_B$. Then $Z_A$ and $Z_B$ are multiplexed by alternating one bit from $Z_A$ then one from $Z_B$ and so on. Note that such a multiplexing scheme may not be optimal, but it is used to illustrate the present invention. The resulting bit sequence is tagged with 1 tail bit and fed to a differential binary phase shift keying (DBPSK) modulator, whose output is a bi-polar (±1) sequence. The sequence is transmitted over an AWGN channel. The received sequence is fed to a MAP demodulator for DBPSK. Note that operations described herein may be considered as either decoding or demodulating. A stage of the trellis for this example is shown in FIG. 13. The differential nature of the modulation is reflected in the mapping from input bits to output bi-polar symbols.

For this example, the MAP demodulator produces log-likelihood ratios (LLRs) for all the bits, as in Equation 12. The LLRs are de-multiplexed and de-interleaved appropriately to produce a sequence of LLRs, with the first half $\Lambda_A$ and second half $\Lambda_B$, corresponding to $Z_A$ and $Z_B$, respectively. Then a MAP decoder is applied to $\Lambda_A$ and $\Lambda_B$ sequentially to produce estimates for X.

In accordance with embodiments of the present invention, in addition to the bit LLRs, the MAP demodulator also produces the joint probability for 2 bits from adjacent stages, as in Equation 15. Due to the multiplexing scheme, each joint probability contains one bit from $Z_A$ and one bit from $Z_B$. For simplicity, only those joint probabilities where the $1^{st}$ bit is from $Z_A$ and the $2^{nd}$ bit is from $Z_B$ may be used. Those joint probabilities are denoted as $J(z_A, z_B)$. The individual bit LLRs $\Lambda_A$ are processed as described in the previous paragraph, except a fixed-lag MAP decoder is used. This fixed-lag decoder also sequentially extracts LLR values $\Lambda_A^{dec}$ associated with the bits in the set $Z_A$. This information is obtainable from the MAP decoder, using an equation such as Equation 11. The quantity $\Lambda_A^{dec}$ represents the knowledge provided by the decoder about $Z_A$. This knowledge is used to compute improved LLRs associated with $Z_B$.

One approach according to the present invention for using such information includes obtaining the net (or extrinsic) knowledge from the MAP decoder for $Z_A$:

$$\Lambda_A^{ext} = \Lambda_A^{dec} - \Lambda_A \quad (20)$$

where $\Lambda_A^{ext}$ is extrinsic information associated with $Z_A$. In the context of turbo-codes, this operation may avoid "overcounting" the effect of the input to the decoder. Then, $\Lambda_A^{ext}$ is fused with $J(z_A, z_B)$. Note that in fusing $\Lambda_A^{ext}$ and $J(a_A, z_B)$ at the appropriate locations, additional indexing is skipped to keep notation reasonable. To do so, $\Lambda_A^{ext}$ may be transformed into a probability, which is denoted $Q(z_A)$ where:

$$Q(z_A = 0) = \frac{\exp(\Lambda_A^{ext})}{1 + \exp(\Lambda_A^{ext})} \qquad (21)$$

and $Q(z_A=1)=1-Q(z_A=0)$. A new LLR for $Z_B$ is computed as:

$$\Lambda_B^{new} = \qquad (22)$$
$$\log\left(\frac{Q(z_A = 0)J(z_A = 0, z_B = 0) + Q(z_A = 1)J(z_A = 1, z_B = 0)}{Q(z_A = 0)J(z_A = 0, z_B = 1) + Q(z_A = 1)J(z_A = 1, z_B = 1)}\right)$$

Finally, $\Lambda_B^{new}$ is fed to the MAP decoder. Note that if $Q(z_A=0)=\frac{1}{2}$, then $\Lambda_B^{new}=\Lambda_B$, as expected. Also, it can be shown that if adjacent bits from $Z_A$ and $Z_B$ are independent, then again $\Lambda_B^{new}=\Lambda_B$.

The present invention is described above generally in the context of a system with coding, interleaving, and modulation. However, it is to be understood that the present invention may be applicable to a variety of situations where one decision device feeds bit reliability information to another decision device.

For example, consider the situation where feedback is established from the decoder to the demodulator which allows for subsequent iterations of demodulation and decoding. Typically, the decoder would feed back bit reliability information to the demodulator, which combines it with the received values to improve its performance. However, a convolutional code and a corresponding MAP decoder, which produces bit-by-bit reliability information about the coded bits for the benefit of the demodulator may be provided. The present invention may then be applied to the decoder, by extracting joint bit probabilities as well, which can be exploited by the demodulator in the same way as the decoder does in the examples previously described. Thus, various embodiments of the present invention generate the joint probability information from a MAP decoder and re-demodulate the received symbols to provide adjusted demodulated received symbols based on the joint probability information with multi-pass operations.

By way of further example, turbo codes generally consist of 2 (or more) simple convolutional codes, separated by a large state-space, which translates into good performance with an optimal decoder. Because of the peculiar code structure, a low complexity suboptimal decoder also typically works very well. The suboptimal decoder may consist of simple decoders corresponding to the 2 simple component codes and a mechanism to exchange bit-by-bit reliability information between the 2 simple decoders. Improved performance may be achieved by iterating between the 2 decoders, hence the name turbo codes.

One type of turbo coding is called serial turbo coding, where the output of the outer encoder is interleaved then fed to the inner encoder. Such a turbo decoder structure is like a multi-pass receiver for a system with coding, interleaving and modulation. Another type of turbo coding is called parallel turbo coding, where the input to the first encoder is interleaved and fed to the second encoder. In either type of turbo coding, the suboptimal structure allows for the exchange of bit-by-bit reliability information between the decoders. The present invention may thus be applied by extracting joint bit probabilities as well from each decoder, which can be exploited by the other decoder in the same way as the decoder in the examples previously described. As a result, the number of iterations between decoders may be reduced when the exchange of joint probabilities provides richer information than individual bit probabilities. Thus, embodiments of the present invention include turbo decoding, the turbo decoding including a first decoding separated by an interleaver from a second decoding. Turbo decoding the demodulated received symbols in such embodiments includes generating joint probability information associated with the first and the second symbol from the first decoding for use in the second decoding and from the second decoding for use in the first decoding.

By way of further example, some systems combine inner modulation with an outer, non-binary code. When the inner modulation displays a strong correlation, it may be advantageous to match it to an outer code whose alphabet is roughly the size of a highly correlated modulation block. For instance, suppose that the inner modulation is 8-PSK and that 2 consecutive symbols are highly correlated. Then an outer code with an alphabet containing 64 "letters" is typically desirable. An example is a Reed-Solomon code. The 64 joint probabilities for consecutive symbol pairs can be used directly as letter probabilities by the outer decoder. In addition, if the system uses interleaving, it is generally desirable to scramble the code letters without breaking them up. In other words, the interleaver should be a letter-interleaver. In this manner, the relationship between letters and symbol pairs is preserved. The embodiments of the present invention include receiving bits transmitted with inner modulation and an outer code where the inner modulation displays a correlation and the outer code is selected to correspond to a correlated modulation block of the inner modulation. The inner modulation may, for example, be 8-PSK having two consecutive correlated symbols and the outer code may have an alphabet including 64 letters. In such cases 64 joint probabilities are generated for consecutive symbol pairs and the generated joint probabilities are used as letter probabilities for decoding the outer code.

From an implementation viewpoint, it may be advantageous to store and compute probabilities in the logarithmic domain. This is due to the fact that, in the scenarios of interest, the dynamic range of probabilities is typically very large. As mentioned earlier, for the AWGN channel, the probabilities in Equation 1 have an exponential form, which implies a large dynamic range.

Consider the simple sum $U=V+W$, let $u=\ln(U)$, $v=\ln(V)$ and $w=\ln(W)$. Then we can write $u=\ln(e^v+e^w)$. This relation is often called the COM operator, that is $u=com(v,w)$. It has a recursion property which makes it useful for sums of more than two elements:

$$e^v+e^w+e^x=COM(COM(v,w),x) \qquad (23)$$

The COM operator can be implemented as follows to reduce numerical problems:

$$COM(v,w)=\max(v,w)+\ln(1+e^{-|v-w|}) \qquad (24)$$

If needed, the COM operators can be applied to various equations, including Equations 6, 7, 11, 15 and 22. Also, the probabilities $\alpha$, $\beta$, $\gamma$, $J$ etc. can be stored in logarithmic form.

Figure 10:
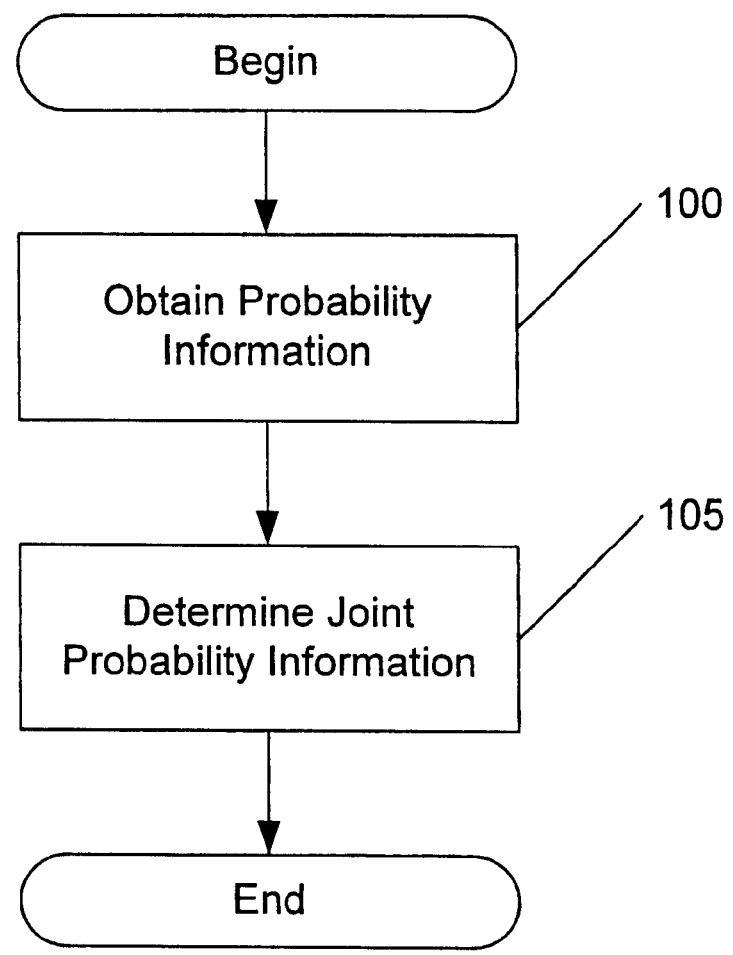
FIG. 10 is a flowchart illustrating extracting a joint probability from a MAP decision device according to embodiments of the present invention.
Figure 11:
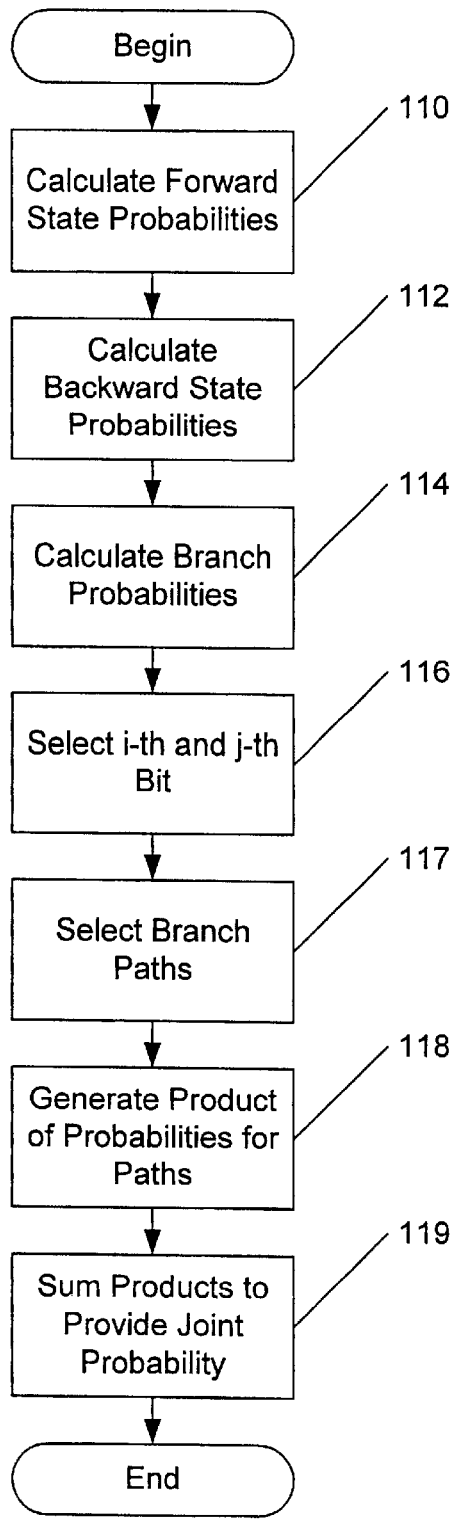
FIG. 11 is a flowchart illustrating extracting a joint probability from a MAP decision device according to further embodiments of the present invention.
Figure 12:
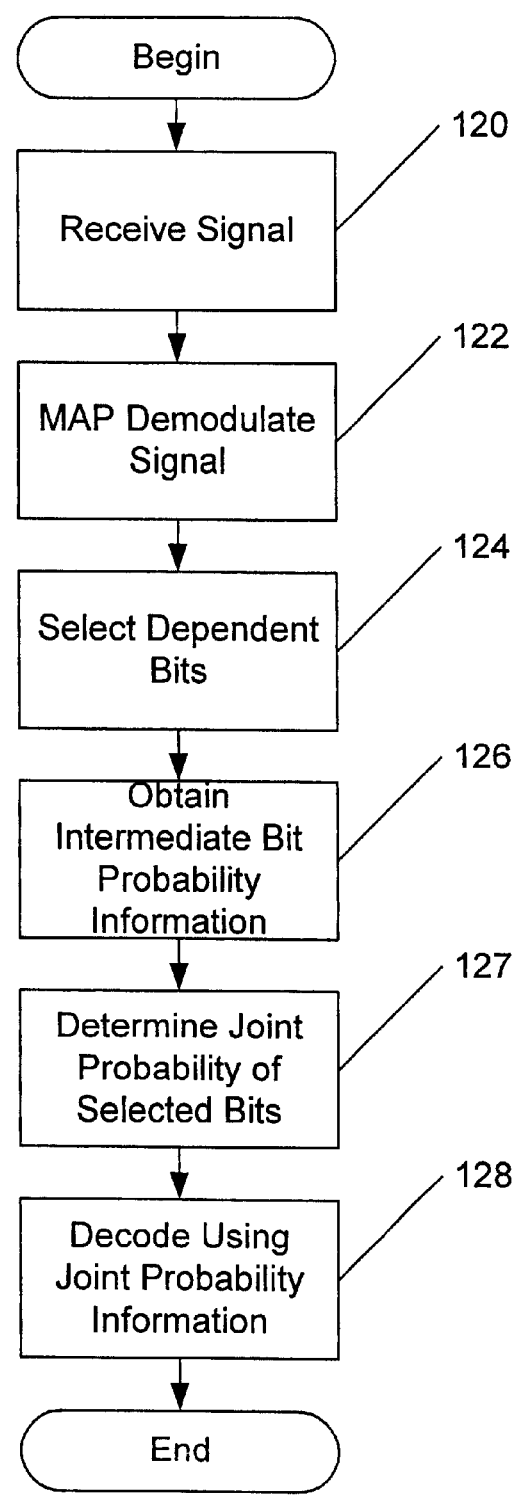
FIG. 12 is a flowchart illustrating processing a signal containing information associated with a plurality of transmitted bits according to embodiments of the present invention.

Operations of the present invention have been described with respect to the block diagram illustrations of FIGS. 8 and 9 and the flowchart illustrations of FIGS. 10 through 12. It will be understood that each block of the flowchart illustrations and the block diagram illustrations of FIGS. 8 through 12, and combinations of blocks in the flowchart illustrations and the block diagram illustrations, can be implemented by computer program instructions. These program instructions may be provided to a processor to produce a machine, such that the instructions which execute on the processor create means for implementing the functions specified in the flowchart and block diagram block or blocks. The computer program instructions may be executed by a processor to cause a series of operational steps to be performed by the processor to produce a computer implemented process such that the instructions which execute on the processor provide steps for implementing the functions specified in the flowchart and block diagram block or blocks.

Accordingly, blocks of the flowchart illustrations and the block diagrams support combinations of means for performing the specified functions, combinations of steps for performing the specified functions and program instruction means for performing the specified functions. It will also be understood that each block of the flowchart illustrations and block diagrams, and combinations of blocks in the flowchart illustrations and block diagrams, can be implemented by special purpose hardware-based systems which perform the specified functions or steps, or by combinations of special purpose hardware and computer instructions. For example the demodulator 92, the deinterleaver 94 and the decoder 96 may all be implemented as code executing on a processor, as integrated circuit devices, such as signal processors or custom chips, or as a combination of the above.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for extracting a joint probability from a MAP decision device comprising:

obtaining probability information associated with a first symbol and a second symbol from the MAP decision device; and determining a joint probability of at least the first symbol and the second symbol from the probability information associated with the first symbol and the second symbol.

2. The method of claim 1 wherein the probability information associated with the first symbol and the second symbol comprises at least one of a branch probability, a forward state probability and a backward state probability.

3. The method of claim 1 wherein the MAP decision device operates on a trellis and wherein determining a joint probability of the first symbol and the second symbol from the probability information associated with the first symbol and the second symbol comprises determining a joint probability of the first symbol at a (k−n)-th stage of the trellis, where n is at least one, and the second symbol at a k-th stage of the trellis from the probability information associated with the first symbol and the second symbol.

4. The method of claim 3 wherein obtaining probability information associated with a first symbol and a second symbol from the MAP decision device comprises:

calculating at least one forward state probability through the (k−n)-th stage of the trellis;

calculating at least one backward state probability through the k-th stage of the trellis; and calculating at least one branch probability between a state at the (k−n)-th stage of the trellis and a state at the k-th stage of the trellis; and wherein determining a joint probability of the first symbol and the second symbol from the probability information associated with the first symbol and the second symbol comprises:

selecting an i-th information symbol at the (k−n)-th stage of the trellis as the first symbol and a j-th information symbol at the k-th stage of the trellis as the second symbol; and determining a joint probability of the first symbol and the second symbol from the calculated forward state probabilities, reverse state probabilities and branch probabilities based on the selected i-th information symbol and j-th information symbol.

5. The method of claim 4 wherein n equals one.

6. The method of claim 4 wherein determining a joint probability of the first symbol and the second symbol from the calculated forward state probabilities, reverse state probabilities and branch probabilities based on the selected i-th information symbol and j-th information symbol comprises:

selecting branch paths having an i-th symbol label of a branch from the (k−n)-th stage corresponding to the selected i-th information symbol and a j-th symbol label of a branch into the k-th stage corresponding to the selected j-th information symbol;

generating a product of an associated forward state probability, backward state probability and branch probability for each of the selected branch paths; and summing the generated products to provide the joint probability of the first symbol and the second.

7. The method of claim 6 wherein calculating at least one branch probability between a state at the (k−n)-th stage of the trellis and a state at the k-th stage of the trellis further comprises calculating a channel information based probability and prior information about a branch based probability and combining the channel information based probability and prior information about a branch based probability to provide a branch probability for a branch.

8. The method of claim 7 wherein n equals one.

9. The method of claim 6 wherein n equals one.

10. The method of claim 6 wherein the MAP decision device is at least one of an equalizer and a decoder.

11. The method of claim 6 wherein a symbol comprises a bit.

12. The method of claim 1 wherein the MAP decision device is at least one of an equalizer and a decoder.

13. The method of claim 1 wherein a symbol comprises a bit.

14. The method of claim 1 wherein obtaining probability information associated with a first symbol and a second symbol from the MAP decision device further comprises obtaining probability information associated with a third symbol from the MAP decision device; and wherein determining a joint probability of at least the first symbol and the second symbol from the probability information associated with the first symbol and the second symbol comprises determining a joint probability of at least the first symbol, the second symbol and the third symbol from the probability information associated with the first symbol, the second symbol and the third symbol.

15. A method for processing a signal containing information associated with a plurality of transmitted bits, the signal being received over a channel from a transmitter comprising:

demodulating the signal to provide demodulated received symbols;

decoding the demodulated received symbols to provide estimates of the transmitted bits;

wherein at least one of demodulating the received symbols and decoding the demodulated received symbols further comprises generating joint probability information from a MAP decision device, the joint probability information being used during at least one of demodulating and decoding to provide the estimates of the transmitted bits; and wherein generating the joint probability information from a MAP decision device further comprises:

selecting a first one of the received symbols and a second one of the received symbols, the first symbol and the second symbol being expected to have a joint probability different from the product of their respective symbol probabilities;

obtaining probability information associated with the first symbol and the second symbol from the MAP decision device; and determining a joint probability of at least the first symbol and the second symbol from the obtained probability information associated with the first symbol and the second symbol.

16. The method of claim 15 wherein the MAP decision device operates on a trellis and wherein determining a joint probability of the first symbol and the second symbol from the obtained probability information associated with the first symbol and the second symbol comprises determining a joint probability of the first symbol at a (k–n)-th stage of the trellis, where n is at least one, and the second symbol at a k-th stage of the trellis from the probability information associated with the first symbol and the second symbol.

17. The method of claim 16 wherein obtaining probability information associated with the first symbol and the second symbol from the MAP decision device comprises:

calculating at least one forward state probability through the (k–n)-th stage of the trellis;

calculating at least one backward state probability through the k-th stage of the trellis; and calculating at least one branch probability between a state at the (k–n)-th stage of the trellis and a state at the k-th stage of the trellis; and wherein determining a joint probability of the first symbol and the second symbol from the obtained probability information associated with the first symbol and the second symbol comprises:

selecting an i-th information symbol at the (k–n)-th stage of the trellis as the first symbol and a j-th information symbol at the k-th stage of the trellis as the second symbol; and determining a joint probability of the first symbol and the second symbol from the calculated forward state probabilities, reverse state probabilities and branch probabilities based on the selected i-th information symbol and j-th information symbol.

18. The method of claim 17 wherein n equals one.

19. The method of claim 17 wherein determining a joint probability of the first symbol and the second symbol from the calculated forward state probabilities, reverse state probabilities and branch probabilities based on the selected i-th information symbol and j-th information symbol comprises:

selecting branch paths having an i-th symbol label of a branch from the (k–n)-th stage corresponding to the selected i-th information symbol and a j-th symbol label of a branch into the k-th stage corresponding to the selected j-th information symbol;

generating a product of an associated forward state probability, backward state probability and branch probability for each of the selected branch paths; and summing the generated products to provide the joint probability of the first symbol and the second.

20. The method of claim 15 wherein demodulating the received symbols further comprises generating joint probability information associated with the first and the second symbol from a MAP demodulator and wherein decoding the demodulated received symbols further comprises fixed-lag decoding the received symbols to provide adjusted probability information associated with one of the first and the second symbol based on probability information about the other of the first and the second symbol generated during decoding and the joint probability information associated with the first and the second symbol from demodulating.

21. The method of claim 20 wherein a plurality of the transmitted bits, including ones associated with the first symbol and the second symbol, are coded, interleaved and modulated for transmission as the signal.

22. The method of claim 15 wherein decoding the demodulated received symbols further comprises generating joint probability information associated with the first and the second symbol from a MAP decoder and wherein decoding the demodulated received symbols is followed by re-demodulating the received symbols to provide adjusted demodulated received symbols based on the joint probability information associated with the first and the second symbol from decoding.

23. The method of claim 22 wherein a plurality of the transmitted bits, including ones associated with the first symbol and the second symbol, are coded, interleaved and modulated for transmission as the signal.

24. The method of claim 15 wherein decoding the demodulated received symbols further comprises turbo decoding the demodulated received symbols, the turbo decoding including a first decoding separated by an interleaver from a second decoding and wherein turbo decoding the demodulated received symbols further comprises generating joint probability information associated with the first and the second symbol from the first decoding for use in the second decoding and from the second decoding for use in the first decoding.

25. The method of claim 24 wherein a plurality of the transmitted bits, including ones associated with the first symbol and the second symbol, are coded, interleaved and modulated for transmission as the signal.

26. The method of claim 15 wherein a plurality of the transmitted bits, including ones associated with the first symbol and the second symbol, are transmitted with inner modulation and an outer code.

27. The method of claim 26 wherein the inner modulation displays a correlation and wherein the outer code is selected to correspond to a correlated modulation block of the inner modulation.

28. The method of claim 27 wherein the inner modulation is 8-PSK having two consecutive correlated symbols and wherein the outer code has an alphabet including 64 letters and wherein generating joint probabilities information comprises generating 64 joint probabilities for consecutive symbol pairs and using the generated joint probabilities as letter probabilities for decoding the outer code.

29. The method of claim 27 wherein the transmitted bits are interleaved for transmission and wherein code letters of the outer code are scrambled without breaking the code letters up.

30. The method of claim 15 wherein obtaining probability information associated with the first symbol and the second symbol from the MAP decision device further comprises obtaining probability information associated with a third symbol from the MAP decision device; and wherein determining a joint probability of at least the first symbol and the second symbol from the obtained probability information associated with the first symbol and the second symbol comprises determining a joint probability of at least the first symbol, the second symbol and the third symbol from the obtained probability information associated with the first symbol, the second symbol and the third symbol.

31. A MAP decision device providing joint probability information comprising:
   an intermediate value output circuit that generates probability information associated with a first symbol and a second symbol being processed by the MAP decision device; and
   a joint probability calculation circuit that generates a joint probability of at least the first symbol and the second symbol from the probability information associated with the first symbol and the second symbol.

32. The device of claim 31 wherein the MAP decision device is an equalizer or a decoder that provides soft information about processed symbols.

33. The device of claim 32 wherein the intermediate value output circuit generates at least one of branch probabilities, forward state probabilities and reverse state probabilities.

34. The device of claim 33 wherein a symbol is a bit.

35. The device of claim 33 wherein the MAP decision devices operates on a trellis and wherein the joint probability calculation circuit determines a joint probability of the first symbol at a (k–n)-th stage of the trellis, where n is at least one, and the second symbol at a k-th stage of the trellis from the probability information associated with the first symbol and the second symbol.

36. The device of claim 35 wherein the intermediate value output circuit calculates forward state probabilities through the (k–n)-th stage of the trellis, backward state probabilities through the k-th stage of the trellis and branch probabilities between a state at the (k–n)-th stage of the trellis and a state at the k-th stage of the trellis, and wherein the joint probability determination circuit selects an i-th information symbol at the (k–n)-th stage of the trellis as the first symbol and a j-th information symbol at the k-th stage of the trellis as the second symbol and determines a joint probability of the first symbol and the second symbol from the calculated forward state probabilities, reverse state probabilities and branch probabilities based on the selected i-th information symbol and j-th information symbol.

37. The device of claim 36 wherein n equals one.

38. The device of claim 36 wherein the joint probability determination circuit selects branch paths having an i-th symbol label of a branch from the (k–n)-th stage corresponding to the selected i-th information symbol and a j-th symbol label of a branch into the k-th stage corresponding to the selected j-th information symbol, generates a product of an associated forward state probability, backward state probability and branch probability for each of the selected branch paths, and sums the generated products to provide the joint probability of the first symbol and the second.

39. The device of claim 31 wherein the intermediate value output circuit generates probability information associated with a third symbol being processed by the MAP decision device; and
   wherein the joint probability calculation circuit generates a joint probability of at least the first symbol, the second symbol and the third symbol from the probability information associated with the first symbol, the second symbol and the third symbol.

40. A receiver device for processing a signal containing information associated with a plurality of transmitted bits, the signal being received over a channel from a transmitter, the receiver device comprising:
   a signal processor circuit that receives the signal;
   a demodulator that demodulates the received signal to provide demodulated received symbols; and
   a decoder that decodes the demodulated received symbols to provide estimates of the transmitted bits; and
   wherein at least one of the demodulator and the decoder comprises a MAP decision device providing joint probability information, the MAP detection device comprising:
      an intermediate value output circuit that generates probability information associated with a first symbol and a second symbol being processed by the MAP decision device; and
      a joint probability calculation circuit that generates a joint probability of at least the first symbol and the second symbol from the probability information associated with the first symbol and the second symbol; and
   wherein the generated joint probability is used by at least one of the demodulator and the decoder to provide the estimates of the transmitted bits.

41. The receiver device of claim 40 wherein the receiver device is one of a wireless terminal, a base station or a mobile switching center receiving the transmitted signal.

42. The receiver device of claim 41 wherein the first symbol and the second symbol have a joint probability different from a product of their respective symbol probabilities.

43. The receiver device of claim 42 wherein the first symbol and the second symbol have a coupling introduced by at least one of the transmitter and the channel.

44. The receiver device of claim 43 wherein the intermediate value output circuit generates at least one of branch probabilities, forward state probabilities and reverse state probabilities.

45. The device of claim 44 wherein a symbol is a bit.

46. The device of claim 44 wherein the MAP decision devices operates on a trellis and wherein the joint probability calculation circuit determines a joint probability of the first symbol at a (k–n)-th stage of the trellis, where n is at least one, and the second symbol at a k-th stage of the trellis from the probability information associated with the first symbol and the second symbol.

47. The device of claim 46 wherein the intermediate value output circuit calculates forward state probabilities through the (k–n)-th stage of the trellis, backward state probabilities through the k-th stage of the trellis and branch probabilities between a state at the (k–n)-th stage of the trellis and a state at the k-th stage of the trellis, and wherein the joint probability determination circuit selects an i-th information symbol at the (k–n)-th stage of the trellis as the first symbol and a j-th information symbol at the k-th stage of the trellis as the second symbol and determines a joint probability of the first symbol and the second symbol from the calculated forward state probabilities, reverse state probabilities and branch probabilities based on the selected i-th information symbol and j-th information symbol.

48. The device of claim 47 wherein n equals one.

49. The device of claim 47 wherein the joint probability determination circuit selects branch paths having an i-th symbol label of a branch from the (k–n)-th stage corresponding to the selected i-th information symbol and a j-th symbol label of a branch into the k-th stage corresponding to the selected j-th information symbol, generates a product of an associated forward state probability, backward state probability and branch probability for each of the selected branch paths, and sums the generated products to provide the joint probability of the first symbol and the second.

50. The device of claim 40 wherein the intermediate value output circuit generates probability information associated with a third symbol being processed by the MAP decision device; and wherein the joint probability calculation circuit generates the joint probability of at least the first symbol, the second symbol and the third symbol from the probability information associated with the first symbol, the second symbol and the third symbol.

* * * * *